(12) United States Patent
Lee et al.

(10) Patent No.: US 12,308,274 B2
(45) Date of Patent: May 20, 2025

(54) ELECTROSTATIC CHUCK SHEET AND ELECTROSTATIC CHUCK COMPRISING SAME

(71) Applicant: AMOSENSE CO., LTD., Cheonan-si (KR)

(72) Inventors: Jihyung Lee, Cheonan-si (KR); Kyungwhan Woo, Cheonan-si (KR); Byoungsu Jin, Cheonan-si (KR); Sungbaek Dan, Cheonan-si (KR); Youngjun An, Cheonan-si (KR); Seunggon Park, Cheonan-si (KR); Kihoon Nam, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 117 days.

(21) Appl. No.: 18/281,750

(22) PCT Filed: Mar. 14, 2022

(86) PCT No.: PCT/KR2022/003494
§ 371 (c)(1),
(2) Date: Sep. 12, 2023

(87) PCT Pub. No.: WO2022/191676
PCT Pub. Date: Sep. 15, 2022

(65) Prior Publication Data
US 2024/0312822 A1    Sep. 19, 2024

(30) Foreign Application Priority Data
Mar. 12, 2021   (KR) .................... 10-2021-0032867

(51) Int. Cl.
*H01T 23/00* (2006.01)
*H01L 21/683* (2006.01)

(52) U.S. Cl.
CPC ................. *H01L 21/6833* (2013.01)

(58) Field of Classification Search
None
See application file for complete search history.

(56) References Cited

U.S. PATENT DOCUMENTS

| 2014/0008880 A1 | 1/2014 | Miura et al. |
| 2016/0196999 A1 | 7/2016 | Yanoh et al. |

(Continued)

FOREIGN PATENT DOCUMENTS

| JP | 2002-083862 A | 3/2002 |
| JP | 2004-349666 A | 12/2004 |

(Continued)

OTHER PUBLICATIONS

KR Office Action dated Jan. 28, 2024 as received in Application No. 10-2021-0032867.

(Continued)

*Primary Examiner* — Stephen W Jackson
(74) *Attorney, Agent, or Firm* — Maschoff Brennan

(57) ABSTRACT

Disclosed is an electrostatic chuck sheet included in an electrostatic chuck for chucking a substrate by using electrostatic force. The electrostatic chuck sheet comprises: a first dielectric layer comprising a polymer material; a first electrode layer, which is arranged on the first dielectric layer and comprises first electrodes made of a conductive metal material; a second electrode layer, which is arranged on the first electrode layer and comprises second electrodes made of a conductive metal material; an interlayer dielectric layer, which is arranged between the first electrode layer and the second electrode layer and comprises a polymer material; and a protective layer, which is arranged on the second electrode layer and comprises a polymer material, wherein the first electrodes and the second electrodes are arranged so (Continued)

as not to overlap each other in the direction perpendicular to the electrostatic chuck sheet.

13 Claims, 4 Drawing Sheets

(56) References Cited

U.S. PATENT DOCUMENTS

| | | | |
|---|---|---|---|
| 2020/0161158 A1* | 5/2020 | Liu | B23Q 3/152 |
| 2020/0211883 A1* | 7/2020 | Thirunavukarasu | H01L 21/6835 |
| 2023/0402943 A1* | 12/2023 | Lee | H01L 21/6833 |

FOREIGN PATENT DOCUMENTS

| | | |
|---|---|---|
| KR | 10-2008-0058144 A | 6/2008 |
| KR | 10-2014-0004756 A | 1/2014 |
| KR | 10-2016-0105764 A | 9/2016 |
| KR | 10-2018-0049855 A | 5/2018 |
| KR | 10-2020-0000696 A | 1/2020 |
| KR | 10-2020-0088639 A | 7/2020 |
| WO | 2020027246 A1 | 2/2020 |

OTHER PUBLICATIONS

KR Office Action dated Jun. 12, 2024 in application 1020210032867.

* cited by examiner

[FIG. 1]
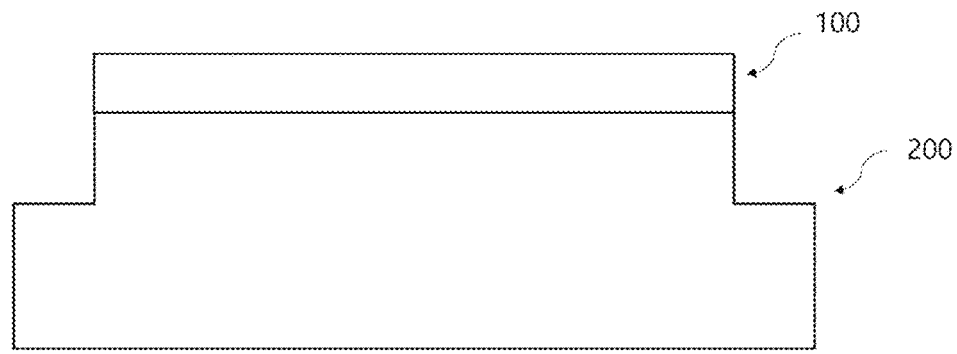
[FIG. 2]
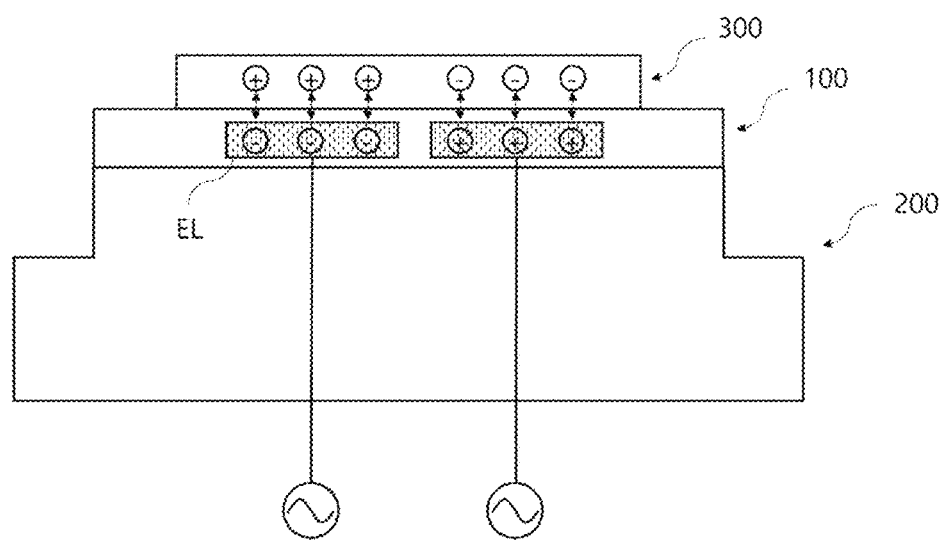
[FIG. 3]
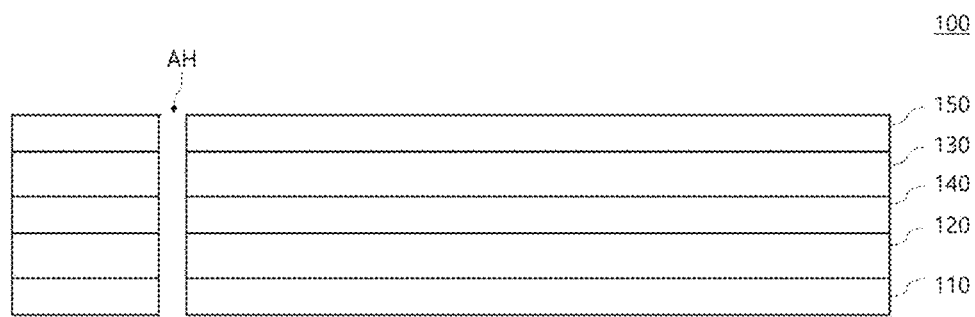

[FIG. 4]
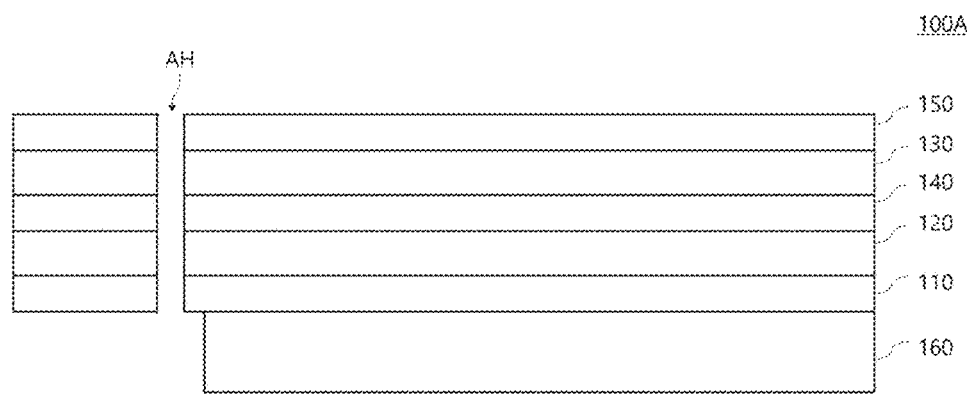
[FIG. 5]
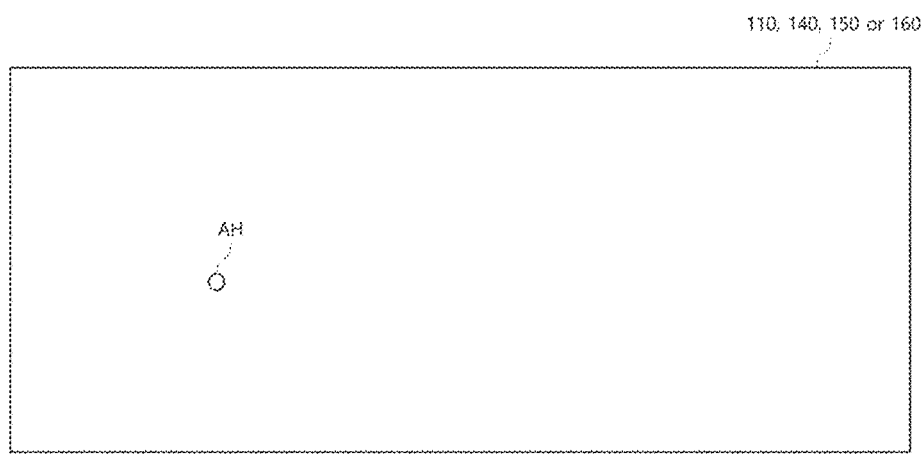

[FIG. 6]
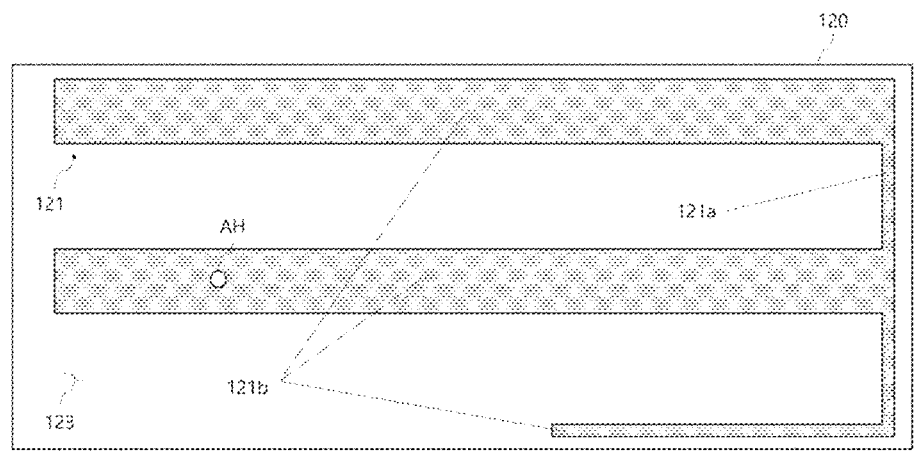
[FIG. 7]
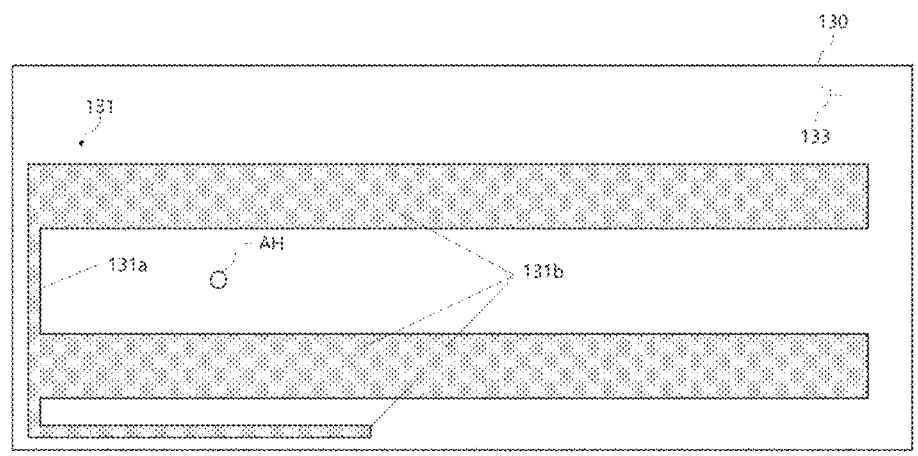

[FIG. 8]
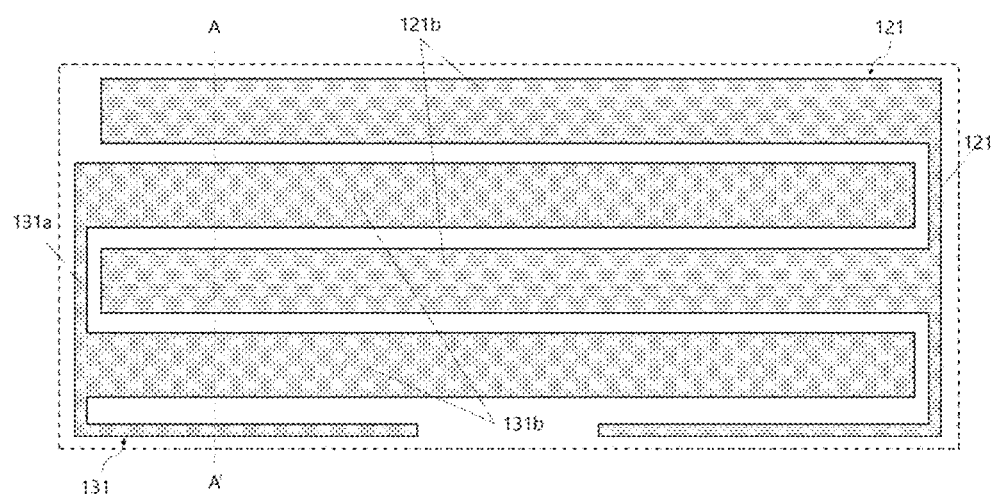
[FIG. 9]
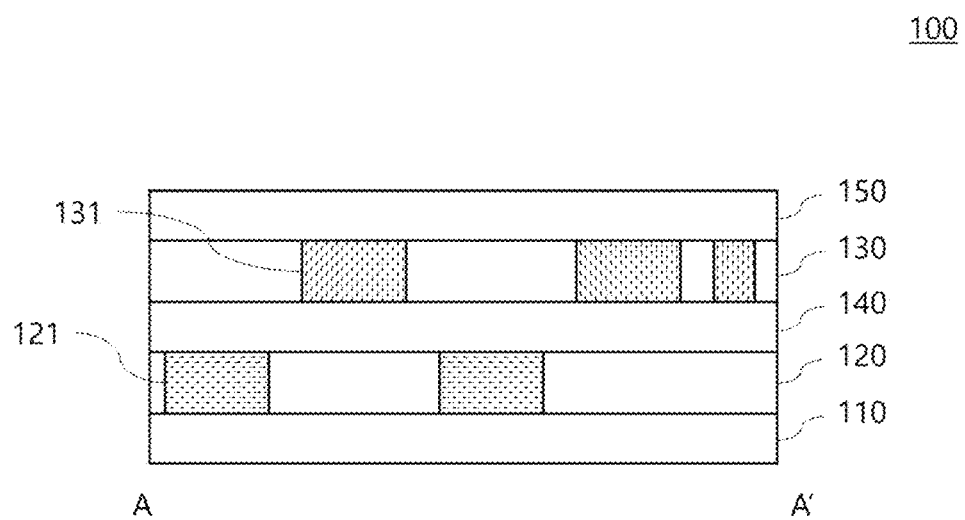

ELECTROSTATIC CHUCK SHEET AND ELECTROSTATIC CHUCK COMPRISING SAME

TECHNICAL FIELD

Embodiments of the present disclosure relate to an electrostatic chuck sheet capable of fixing an object, such as a semiconductor wafer, a printed circuit board, or a glass substrate, by using an electrostatic force and an electrostatic chuck including the same.

BACKGROUND ART

A semiconductor or an electronic circuit is manufactured by performing several processes (e.g., photographing, etching, patterning, and cleaning) on a substrate, such as a wafer or a printed circuit board. In this case, the substrate needs to be fixed in order for the processes to be properly performed. The accuracy and success rate of the process may depend on whether the substrate has been fixed.

An electrostatic chuck is widely used to fix (i.e., chuck) an object having a substrate form by using an electrostatic force and to coalese, pressurize, and move the fixed object. In general, the electrostatic chuck includes an electrostatic chuck sheet including an electrode, that is, a conductor, and a dielectric that surrounds the electrode, and a conductive base plate disposed under the electrostatic chuck sheet. In this case, when a voltage is applied to the electrode, the object can be fixed through an electrostatic force. In this case, the dielectric may be polyimide (PI) or a ceramic material, wherein the former is called a PI chuck and the latter is called a ceramic chuck.

DISCLOSURE

Technical Problem

An object to be solved by the present disclosure is to provide an electrostatic chuck sheet having a heat-resisting property that is not deformed even at a high temperature (e.g., a temperature of 250° C. or more) and an electrostatic chuck including the same.

An object to be solved by the present disclosure is to provide an electrostatic chuck sheet capable of preventing an arcing phenomenon attributable to a leakage current between electrodes by securing the distance between the electrodes that form an electrostatic field and an electrostatic chuck including the same.

An object to be solved by the present disclosure is to provide an electrostatic chuck sheet capable of improving a chucking force in a way to maximize the area in which two electrodes that form an electrostatic field are disposed by alternately disposing the two electrodes in a horizontal direction and an electrostatic chuck including the same.

TECHNICAL SOLUTION

An electrostatic chuck sheet included in an electrostatic chuck for chucking a substrate by using an electrostatic force according to embodiments of the present disclosure includes a first dielectric layer including a polymer material, a first electrode layer disposed over the first dielectric layer and including a first electrode of a conductive metal material, a second electrode layer disposed over the first electrode layer and including a second electrode of a conductive metal material, an inter-dielectric layer disposed between the first electrode layer and the second electrode layer and including a polymer material, and a passivation layer disposed over the second electrode layer and including a polymer material. The first electrode and the second electrode are disposed to not overlap in a vertical direction of the electrostatic chuck sheet.

Advantageous Effects

The electrostatic chuck sheet and the electrostatic chuck including the same according to embodiments of the present disclosure have effects in that the electrostatic chuck sheet can have a heat-resisting property that is not deformed even at a high temperature (e.g., a temperature of 250° C. or more) and can stably fix an object without deforming or destroying the object although a process is performed on the object at a high temperature.

The electrostatic chuck sheet and the electrostatic chuck including the same according to embodiments of the present disclosure have an effect in that an arcing phenomenon can be prevented by disposing two electrodes that form an electrostatic field so that the two electrodes do not overlap each other in a vertical direction in order to secure the distance between the two electrodes.

The electrostatic chuck sheet and the electrostatic chuck including the same according to embodiments of the present disclosure have an effect in that a chucking force can be improved in a way to maximize the area in which two electrodes that form an electrostatic field are disposed by alternately disposing the two electrodes in a horizontal direction.

DESCRIPTION OF DRAWINGS

FIG. 1 illustrates an electrostatic chuck according to embodiments of the present disclosure.

FIG. 2 is a diagram illustrating an operation of the electrostatic chuck according to embodiments of the present disclosure.

FIG. 3 illustrates an electrostatic chuck sheet according to embodiments of the present disclosure.

FIG. 4 illustrates an electrostatic chuck sheet according to embodiments of the present disclosure.

FIG. 5 illustrates a plan view of the remaining layers except electrode layers, among the layers of the electrostatic chuck sheet according to embodiments of the present disclosure.

FIG. 6 illustrates a plan view of a first electrode layer according to embodiments of the present disclosure.

FIG. 7 illustrates a plan view of a second electrode layer according to embodiments of the present disclosure.

FIG. 8 illustrates a form in which two electrodes are viewed from the top according to embodiments of the present disclosure.

FIG. 9 illustrates a cross-sectional view of the electrostatic chuck sheet, which is viewed along line A-A' in FIG. 8.

MODE FOR INVENTION

Hereinafter, embodiments of the present disclosure are described with reference to the accompanying drawings.

The drawings accompanied by this specification are exemplary drawings that are used to describe the technical spirit of the present disclosure, and the technical spirit of the present disclosure is not limited to scales or dimensions indicated in the drawings.

FIG. 1 illustrates an electrostatic chuck according to embodiments of the present disclosure. Referring to FIG. 1, the electrostatic chuck may include an electrostatic chuck sheet 100 and a base plate 200.

The electrostatic chuck sheet 100 may come into contact with one surface of an object, that is, an object to be fixed, and may chuck the object by an electrostatic force. Accordingly, the location of the object may be fixed by the electrostatic chuck sheet 100. In this case, the object may be a silicon wafer, a printed circuit board (PCB), a glass substrate, or a polyimide (PI) substrate, but embodiments of the present disclosure are not limited to the property or shape of an object.

The electrostatic chuck sheet 100 may have a shape corresponding to a shape of the object with which the electrostatic chuck sheet 100 comes into contact. For example, if the electrostatic chuck sheet 100 supports a circular object such as a semiconductor wafer, the electrostatic chuck sheet 100 may be formed in a circular form. If the electrostatic chuck sheet 100 supports a quadrilateral object such as a printed circuit substrate, the electrostatic chuck sheet 100 may be formed in a quadrilateral form.

The base plate 200 may be combined with the electrostatic chuck sheet 100, and may support the electrostatic chuck sheet 100. According to embodiments, the electrostatic chuck sheet 100 and the base plate 200 may be connected by a connection member such as a bolt. For example, the connection member may penetrate the electrostatic chuck sheet 100, may be partially received in the base plate 200, and may combine the electrostatic chuck sheet 100 and the base plate 200. Furthermore, according to embodiments, the electrostatic chuck sheet 100 and the base plate 200 may be combined by an adhesive or a sticking agent.

The base plate 200 may be made of a metal material. For example, the base plate 200 may be made of metal including aluminum. In this case, the base plate 200 may play a role as a heat-dissipating member that discharges heat from the electrostatic chuck sheet 100.

FIG. 2 is a diagram illustrating an operation of the electrostatic chuck according to embodiments of the present disclosure. Referring to FIG. 2, the electrostatic chuck sheet 100 includes an electrode EL. The electrode EL may be connected to a power source, and may receive a voltage from the power source. For example, the power source may be constructed in a connector form. Furthermore, the electrode EL may include at least two electrodes that are electrically separated from each other. Voltages having different signs may be applied to the at least two electrodes.

An object 300 may be seated on the electrostatic chuck sheet 100.

When a voltage is applied to the electrode EL, the electrode EL may be charged with charges. For example, as illustrated in FIG. 2, a left electrode may be charged with (−) charges, and a right electrode may be charged with (+) charges. In this case, the electrode EL of the object 300 and a portion (e.g., a surface of the object 300) corresponding to the electrode EL are charged with charges having opposite signs. For example, as illustrated in FIG. 2, a portion of the object 300 corresponding to the left electrode may be charged with (+) charges, and a portion of the object 300 corresponding to the right electrode may be charged with (−) charges.

The object 300 may be chucked to the electrostatic chuck sheet 100 by attraction (e.g., a Coulomb force) that acts between the charges of the electrostatic chuck sheet 100 and the object 300, which have opposite signs. Accordingly, the electrostatic chuck sheet 100 may selectively chuck the object 300 in response to a voltage applied thereto.

FIG. 3 illustrates an electrostatic chuck sheet according to embodiments of the present disclosure. Referring to FIG. 3, the electrostatic chuck sheet 100 may include a first dielectric layer 110, a first electrode layer 120, a second electrode layer 130, an inter-dielectric layer 140, and a passivation layer 150.

FIG. 3 conceptually illustrates relative locations between the layers 110, 120, 130, 140, and 150 of the electrostatic chuck sheet 100. An actual cross-sectional view of the electrostatic chuck sheet 100 may be different from that of the electrostatic chuck sheet 100 illustrated in FIG. 3.

The first dielectric layer 110 may include a dielectric including a polymer material. According to embodiments, the first dielectric layer 110 may include a polymer material having a heat-resisting property at a temperature of 250° C. or more, preferably, at a temperature of 350° C. or more. For example, the first dielectric layer 110 may be a polymer material layer including polyimide.

The first dielectric layer 110 may come into contact with the base plate 200. For example, the thickness of the first dielectric layer 110 may be 15 to 30 μm, preferably, 25 μm, but embodiments of the present disclosure are not limited thereto.

The electrode layers 120 and 130 may form an electrostatic field depending on a voltage applied thereto. In response to the electrostatic field that is generated by the electrode layers 120 and 130, a surface of an object may be charged with charges of the electrode layers 120 and 130, which have opposite signs. Accordingly, the object may be chucked by the electrostatic chuck sheet 100.

Each of the electrode layers 120 and 130 may include an electrode made of conductive metal. For example, a first electrode may be disposed in the first electrode layer 120, and a second electrode may be disposed in the second electrode layer 130.

The first electrode and the second electrode may each be made of metal having low specific resistance. For example, the first electrode and the second electrode may each include copper (Cu). A voltage may be applied to each of the first electrode and the second electrode. According to embodiments, the voltages that are applied to the first electrode and the second electrode may have different signs, but embodiments of the present disclosure are not limited thereto.

The first electrode layer 120 may be disposed over the first dielectric layer 110. The second electrode layer 130 may be disposed over the first electrode layer 120. In this case, an adhesive layer may be disposed between the first dielectric layer 110 and the first electrode layer 120. For example, the thickness of the adhesive layer may be 15 to 30 μm, preferably, 25 μm, but embodiments of the present disclosure are not limited thereto. According to embodiments, the adhesive layer between the first dielectric layer 110 and the first electrode layer 120 may include an adhesive having a heat-resisting property at a temperature of 250° C. or more, preferably, at a temperature of 350° C. or more.

The inter-dielectric layer 140 may be disposed between the first electrode layer 120, and the second electrode layer 130. The inter-dielectric layer 140 may come into contact with the electrode layers 120 and 130.

The inter-dielectric layer 140 may include a dielectric including a polymer material. According to embodiments, the inter-dielectric layer 140 may be formed of an insulating layer including an insulating material in order to prevent a short circuit between the electrode layers 120 and 130, but embodiments of the present disclosure are not limited thereto. For example, the dielectric constant of the inter-dielectric layer 140 may be lower than the dielectric constant of the first dielectric layer 110, but embodiments of the present disclosure are not limited thereto.

According to embodiments, the inter-dielectric layer 140 may include a polymer insulating material having a heat-resisting property at a temperature of 250° C. or more, preferably, at a temperature of 350° C. or more. For example, the inter-dielectric layer 140 may be a polymer material layer including polyimide.

According to embodiments, the thickness of the inter-dielectric layer 140 may be smaller than the thickness of each of the electrode layers 120 and 130. For example, the thickness of each of the electrode layers 120 and 130 may be 30 to 40 µm, preferably, 35 µm, and the thickness of the inter-dielectric layer 140 may be 15 to 30 µm, preferably, 25 µm, but embodiments of the present disclosure are not limited thereto.

The passivation layer 150 may be disposed at the top of the electrostatic chuck sheet 100. The passivation layer 150 may be a layer for protecting the electrostatic chuck sheet 100 against the outside, and may be a coverlay layer, for example. The passivation layer 150 may come into contact with an object that is fixed by the electrostatic chuck.

According to embodiments, the passivation layer 150 may include a polymer material having a heat-resisting property at a temperature of 250° C. or more, preferably, at a temperature of 350° C. or more. For example, the passivation layer 150 may be a polymer material layer including polyimide.

The passivation layer 150 may be formed to have a color (i.e., a color having higher brightness) that is brighter than the color of an object mounted on the electrostatic chuck sheet 100. For example, the passivation layer 150 may have a white color.

In the case of a semiconductor process, an object (i.e., a wafer or a substrate) needs to be fixed at an accurate location for each process. In particular, a packaging process of the semiconductor process is a process of connecting a semiconductor and a circuit substrate (e.g., a PCB). In the packaging process, a semiconductor chip needs to be mounted at an accurate location of the circuit substrate. In order to adjust the accurate location, process equipment needs to perform alignment by recognizing an alignment mark on the object by using a vision sensor, such as a camera (i.e., vision alignment). In this case, if the object and the electrostatic chuck have similar colors, the alignment mark may not be clearly recognized.

The electrostatic chuck sheet 100 according to embodiments of the present disclosure has effects in that the electrostatic chuck sheet 100 and an object can be easily distinguished with the naked eye and vision alignment can be easily performed on the object because the electrostatic chuck sheet 100 includes the passivation layer 150 having a white color.

The passivation layer 150 may be disposed over the second electrode layer 130. In this case, an adhesive layer may be disposed between the passivation layer 150 and the second electrode layer 130. For example, the thickness of the adhesive layer may be 15 to 30 µm, preferably, 25 µm, but embodiments of the present disclosure are not limited thereto. According to embodiments, the adhesive layer between the passivation layer 150 and the second electrode layer 130 may include an adhesive having a heat-resisting property at a temperature of 250° C. or more, preferably, at a temperature of 350° C. or more.

According to embodiments, the thickness of the passivation layer 150 may be smaller than the thickness of each of the electrode layers 120 and 130. For example, the thickness of the passivation layer 150 may be 15 to 30 µm, preferably, 25 µm, but embodiments of the present disclosure are not limited thereto.

The electrostatic chuck sheet 100 according to embodiments of the present disclosure has an effect in that the electrostatic chuck sheet can stably fix an object without deforming or destroying the object although a process is performed on the object at a high temperature because the electrostatic chuck sheet has a heat-resisting property that is not deformed even at a high temperature (e.g., a temperature of 250° C. or more).

The electrostatic chuck sheet 100 may further include an air hole AH. The air hole AH may be generated to generally penetrate the electrostatic chuck sheet 100. According to embodiments, the air hole AH may be a hole that penetrates the top and bottom of the electrostatic chuck sheet 100. For example, the air hole AH may be formed to penetrate all of the first dielectric layer 110, the first electrode layer 120, the second electrode layer 130, the inter-dielectric layer 140, and the passivation layer 150. Accordingly, the air hole AH may communicate with the base plate 200 that is disposed under the electrostatic chuck sheet 100.

The air hole AH may be used to separate an object that is chucked onto the electrostatic chuck sheet 100 from the electrostatic chuck sheet 100. For example, when a voltage is applied to the electrostatic chuck sheet 100 and the object is chucked by the electrostatic chuck sheet 100, the chucking can be maintained by charges that remain in the electrostatic chuck sheet 100 although a subsequent voltage is not applied to the electrostatic chuck sheet 100. At this time, when air is injected through the air hole AH (e.g., through a nozzle formed in the base plate 200), pressure attributable to the injected air is applied to the chucked object through the air hole AH. As a result, the chucked object may be separated (i.e., dechucked) from the electrostatic chuck sheet 100 by the pressure of the air. Accordingly, the electrostatic chuck sheet 100 according to embodiments of the present disclosure has an effect in that faster dechucking is possible because the electrostatic chuck sheet 100 includes the air hole AH.

FIG. 4 illustrates an electrostatic chuck sheet according to embodiments of the present disclosure. An electrostatic chuck sheet 100A illustrated in FIG. 4 is different from the electrostatic chuck sheet 100 illustrated in FIG. 3 in that the electrostatic chuck sheet 100A further includes a second dielectric layer 160. Accordingly, only the second dielectric layer 160 is described, and the description of the same components is omitted.

FIG. 4 conceptually illustrates relative locations between the layers 110, 120, 130, 140, 150, and 160 of the electrostatic chuck sheet 100A. An actual cross-sectional view of the electrostatic chuck sheet 100A may be different from that of the electrostatic chuck sheet 100A illustrated in FIG. 4.

The second dielectric layer 160 may be disposed under the first dielectric layer 110. According to embodiments, the first dielectric layer 110 may be disposed over the second dielectric layer 160 to cover the entire surface of the second dielectric layer 160. For example, the area of the first dielectric layer 110 may be greater than the area of the second dielectric layer 160.

The thickness of the second dielectric layer 160 may be greater than the thickness of the first dielectric layer 110. For example, the thickness of the second dielectric layer 160 may be 100 to 150 μm, preferably, 125 μm, but embodiments of the present disclosure are not limited thereto.

An adhesive layer including an adhesive may be disposed between the first dielectric layer 110 and the second dielectric layer 160. For example, the first dielectric layer 110 and the second dielectric layer 160 may be bonded together through the adhesive layer. In this case, the thickness of the adhesive layer between the first dielectric layer 110 and the second dielectric layer 160 may be smaller than the thickness of the first dielectric layer 110. For example, the thickness of the adhesive layer may be 10 to 25 μm, preferably, 20 μm, but embodiments of the present disclosure are not limited thereto.

According to embodiments, the adhesive layer between the first dielectric layer 110 and the second dielectric layer 160 may include an adhesive having a heat-resisting property at a temperature of 250° C. or more, preferably, at a temperature of 350° C. or more.

FIG. 5 illustrates a plan view of the remaining layers except the electrode layers, among the layers of the electrostatic chuck sheet according to embodiments of the present disclosure. That is, FIG. 5 illustrates a non-electrode layer of the electrostatic chuck sheet 100. The non-electrode layer may be at least one of the dielectric layers 110 and 120, the inter-dielectric layer 140, and the passivation layer 150.

Referring to FIG. 5, the non-electrode layers 110, 120, 140, and 150 may be disposed within the electrostatic chuck sheet 100 in a layer form. According to embodiments, the air hole AH that penetrates the non-electrode layers 110, 120, 150, and 160 may be formed in the non-electrode layers 110, 120, 150, and 160.

As described above, the non-electrode layers 110, 120, 150, and 160 may each include a polymer material, for example, polyimide having a heat-resisting property at a temperature of 250° C. or more, preferably, at a temperature of 350° C. or more. Furthermore, the adhesive layer may be disposed between each of the non-electrode layers 110, 120, 150, and 160 and each of layers that neighbor the respective non-electrode layers 110, 120, 150, and 160. The adhesive layer may include an adhesive having a heat-resisting property at a temperature of 250° C. or more, preferably, at a temperature of 350° C. or more.

The electrostatic chuck sheet 100 according to embodiments of the present disclosure has an effect in that the electrostatic chuck sheet 100 can stably fix an object without deforming or destroying the object although a process is performed on the object at a high temperature because the electrostatic chuck sheet 100 includes the non-electrode layers 110, 120, 150, and 160 that are not deformed even at a high temperature (e.g., a temperature of 250° C. or more).

FIG. 6 illustrates a plan view of the first electrode layer according to embodiments of the present disclosure. Referring to FIG. 6, the first electrode layer 120 may include a first electrode 121. The first electrode 121 may be connected to a power source, and may receive a voltage (e.g., a (+) voltage) from the power source.

The first electrode 121 may be made of conductive metal. For example, the first electrode 121 may include copper or tungsten, but is not limited thereto.

The first electrode 121 may be a metal pattern having a specific form. According to embodiments, the first electrode 121 may include a stem part 121a that extends in a first direction on the electrostatic chuck sheet 100 and a plurality of branch parts 121b that are connected to the stem part 121a, extend from the stem part 121a, and extend in a second direction that intersects the first direction. For example, the area of the plurality of branch parts 121b may be greater than the area of the stem part 121a, but is not limited thereto.

A dielectric 133 may be disposed around the first electrode 121. According to embodiments, the dielectric 133 may be substantially the same material as the inter-dielectric layer 140. For example, the inter-dielectric layer 140 may be disposed around the first electrode 121. That is, the dielectrics of the inter-dielectric layer 140 may be disposed to surround the first electrode 121.

An air hole AH may be formed to penetrate the first electrode layer 120. According to embodiments, the air hole AH may be formed to penetrate the first electrode 121 or to penetrate the inter-dielectric layer 140.

FIG. 7 illustrates a plan view of the second electrode layer according to embodiments of the present disclosure. Referring to FIG. 7, the second electrode layer 130 may include a second electrode 131. The second electrode 131 may be connected to a power source, and may receive a voltage (e.g., a (−)voltage) from the power source.

The second electrode 131 may be made of conductive metal. For example, the second electrode 131 may include copper or tungsten, but is not limited thereto.

The second electrode 131 may be a metal pattern having a specific form. According to embodiments, the second electrode 131 may include a stem part 131a that extends in a first direction on the electrostatic chuck sheet 100 and a plurality of branch parts 131b that are connected to the stem part 131a, extend from the stem part 131a, and extend in a second direction that intersects the first direction. For example, the area of the plurality of branch parts 131b may be greater than the area of the stem part 131a, but is not limited thereto.

A dielectric 133 may be disposed around the second electrode 131. According to embodiments, the dielectric 133 may be substantially the same material as the inter-dielectric layer 140. For example, the inter-dielectric layer 140 may be disposed around the second electrode 131. That is, the dielectrics of the inter-dielectric layer 140 may be disposed to surround the second electrode 131.

An air hole AH may be formed to penetrate the second electrode layer 130. According to embodiments, the air hole AH may be formed to penetrate the second electrode 131 or the inter-dielectric layer 140.

FIG. 8 illustrates a form in which two electrodes are viewed from the top according to embodiments of the present disclosure. FIG. 9 illustrates a cross-sectional view of the electrostatic chuck sheet, which is viewed along line A-A' in FIG. 8.

For the convenience of description, FIG. 8 illustrates the two electrodes 121 and 131 on one plane, but the two electrodes 121 and 131 do not belong to one plane as described with reference to FIGS. 3 and 4.

Referring to FIGS. 8 and 9, the first electrode 121 and the second electrode 131 may be disposed to at least partially not overlap in a vertical direction (or stack direction) of the electrostatic chuck sheet 100.

An electrostatic chuck using voltages having two polarities needs to include two electrodes to which the two polarities are applied, respectively. In this case, when a leakage current flows between the two electrodes to which the voltages having different polarities are applied, there is a problem in that the electrostatic chuck may be broken because an arc occurs.

The electrostatic chuck according to embodiments of the present disclosure can secure a vertical distance between the electrodes 121 and 131 because the first electrode 121 and the second electrode 131 are disposed in different layers and can secure a horizontal distance between the electrodes 121 and 131 because the first electrode 121 and the second electrode 131 are disposed to not overlap (or, not overlap as much as possible) in the vertical direction. Accordingly, there is an effect in that an arcing phenomenon can be prevented because the leakage current can be prevented from flowing between the first electrode 121 and the second electrode 131.

According to embodiments, a portion (or area) that belongs to the first electrode 121 and that overlaps the vertical direction (or stack direction) of the second electrode 131 and the electrostatic chuck sheet 100 may be 10%, preferably, 5%, more preferably, 1% or less of the entire part (or area) of the first electrode 121. Likewise, a part (or area) that belongs to the second electrode 131 and that overlaps the vertical direction (or stack direction) of the first electrode 121 and the electrostatic chuck sheet 100 may be 10%, preferably, 5%, more preferably, 1% or less of the entire part (or area) of the second electrode 131.

The first electrode 121 and the second electrode 131 may be alternately disposed in the horizontal direction of the electrostatic chuck sheet 100. According to embodiments, the first electrode 121 may be disposed between the second electrodes 131, and the second electrode 131 may be disposed between the first electrodes 121. For example, each of the branch parts 121b of the first electrode 121 may be disposed in an area (or space) that is formed between two branch parts 131b of the second electrode 131. Furthermore, each of the branch parts 131b of the second electrode 131 may be disposed in an area (or space) that is formed between the two branch parts 121b of the first electrode 121.

The chucking force (or fixing power) of the electrostatic chuck sheet 100 is proportional to the amount of charges stored in the electrostatic chuck sheet 100 and an object (a Coulomb force), and may be proportional to a voltage that is applied to the electrostatic chuck sheet 100 and the area of an electrode within the electrostatic chuck sheet 100. The electrostatic chuck sheet 100 according to embodiments of the present disclosure has effects in that the arcing phenomenon can be prevented by securing the distance between the electrodes 121 and 131 because the first electrode 121 and the second electrode 131 are disposed to not overlap in the vertical direction and that the chucking force of the electrostatic chuck sheet 100 can also be increased because the areas of the electrodes 121 and 131 can be maximized because the first electrode 121 and the second electrode 131 are alternately disposed in the horizontal direction.

As described above, although the embodiments have been described in connection with the limited embodiments and drawings, those skilled in the art may modify and change the embodiments in various ways from the description. For example, proper results may be achieved although the above descriptions are performed in order different from that of the described method and/or the aforementioned components, such as the system, structure, device or apparatus, and circuit, are coupled or combined in a form different from that of the described method or replaced or substituted with other components or equivalents.

Accordingly, other implementations, other embodiments, and equivalents of the claims fall within the scope of the claims.

INDUSTRIAL APPLICABILITY

Embodiments of the present disclosure relate to the electrostatic chuck sheet and the electrostatic chuck including the same.

The invention claimed is:
1. An electrostatic chuck sheet included in an electrostatic chuck for chucking a substrate by using an electrostatic force, the electrostatic chuck sheet comprising:
a first dielectric layer comprising a polymer material;
a first electrode layer disposed over the first dielectric layer and comprising a first electrode of a conductive metal material;
a second electrode layer disposed over the first electrode layer and comprising a second electrode of a conductive metal material;
an inter-dielectric layer disposed between the first electrode layer and the second electrode layer and comprising a polymer material; and
a passivation layer disposed over the second electrode layer and comprising a polymer material,
wherein the first electrode and the second electrode are disposed to not overlap in a vertical direction of the electrostatic chuck sheet.
2. The electrostatic chuck sheet of claim 1, wherein at least one of the first dielectric layer, the inter-dielectric layer, and the passivation layer comprises a polymer material having a heat-resisting property at a temperature of 250° C. or more, preferably, at a temperature of 350° C. or more.
3. The electrostatic chuck sheet of claim 1, wherein at least one of the first dielectric layer, the inter-dielectric layer, and the passivation layer comprises polyimide.
4. The electrostatic chuck sheet of claim 1, wherein:
the electrostatic chuck sheet further comprises an adhesive layer, and
the adhesive layer is disposed between the first dielectric layer and the first electrode layer and between the second electrode layer and the passivation layer.
5. The electrostatic chuck sheet of claim 4, wherein the adhesive layer comprises a polymer material having a heat-resisting property at a temperature of 250° C. or more, preferably, at a temperature of 350° C. or more.
6. The electrostatic chuck sheet of claim 1, further comprising a second dielectric layer disposed under the first dielectric layer and comprising a polymer material.
7. The electrostatic chuck sheet of claim 6, wherein a thickness of the first dielectric layer is smaller than a thickness of the second dielectric layer.
8. The electrostatic chuck sheet of claim 6, wherein an area of the first dielectric layer is greater than an area of the second dielectric layer.
9. The electrostatic chuck sheet of claim 1, wherein the first electrode and the second electrode are alternately disposed in a horizontal direction of the electrostatic chuck sheet.
10. The electrostatic chuck sheet of claim 1, wherein:
the first electrode comprises a first stem part and a plurality of first branch parts that extend from the first stem part,
the second electrode comprises a second stem part and a plurality of second branch parts that extend from the second stem part,
each of the first branch parts is disposed in a space that is formed between two branch parts, among the second branch parts, and
each of the second branch parts is formed in a space that is formed between two branch parts, among the first branch parts.
11. The electrostatic chuck sheet of claim 10, wherein each of the first branch parts and each of the second branch parts are disposed to not overlap in the vertical direction of the electrostatic chuck sheet.

12. The electrostatic chuck sheet of claim 1, wherein the electrostatic chuck sheet further comprises an air hole that penetrates all of the first dielectric layer, the first electrode layer, the second electrode layer, the inter-dielectric layer, and the passivation layer.

13. The electrostatic chuck sheet of claim 1, wherein the passivation layer has a white color.

* * * * *